(12) United States Patent
Halberla et al.

(10) Patent No.: US 7,994,806 B2
(45) Date of Patent: Aug. 9, 2011

(54) SYSTEM AND METHOD FOR TESTING EMBEDDED CIRCUITS WITH TEST ISLANDS

(75) Inventors: Holger Halberla, Kranichfeld (DE); Soeren Lohbrandt, Buessleben (DE)

(73) Assignee: X-Fab Semiconductor Foundries AG, Erfurt (DE)

( * ) Notice: Subject to any disclaimer, the term of this patent is extended or adjusted under 35 U.S.C. 154(b) by 506 days.

(21) Appl. No.: 11/817,066

(22) PCT Filed: Dec. 9, 2005

(86) PCT No.: PCT/DE2005/002224
§ 371 (c)(1),
(2), (4) Date: Sep. 11, 2008

(87) PCT Pub. No.: WO2006/061011
PCT Pub. Date: Jun. 15, 2006

(65) Prior Publication Data
US 2010/0026334 A1    Feb. 4, 2010

(30) Foreign Application Priority Data
Dec. 10, 2004   (DE) .......................... 10 2004 059 505

(51) Int. Cl.
*G01R 31/26* (2006.01)
*G01R 31/28* (2006.01)

(52) U.S. Cl. ........... 324/750.3; 324/762.01; 324/762.05; 714/703; 714/733; 714/E11.145

(58) Field of Classification Search .................. 324/763, 324/765; 714/733–734
See application file for complete search history.

(56) References Cited

U.S. PATENT DOCUMENTS
5,565,801 A * 10/1996 Ernst ............................... 327/74
(Continued)

FOREIGN PATENT DOCUMENTS
DE   44 20 988 A1   12/1995
(Continued)

OTHER PUBLICATIONS

Bhavsar, Scan Islands—A Scan Partitioning Architecture and its Implementation on the Alpha 21364 Processor, Proceedings of the 20th IEEE VLSI Test Symposium, 2002.

(Continued)

*Primary Examiner* — Ha Tran T Nguyen
*Assistant Examiner* — Emily Y Chan
(74) *Attorney, Agent, or Firm* — Hunton & Williams, LLP

(57) ABSTRACT

Embodiments of the present disclosure relate to a system and method for testing an embedded circuit in a semiconductor arrangement as part of an overall circuit that is located on a semiconductor wafer, the system and method comprising an arrangement comprising an overall circuit with at least one input and output. The overall circuit may be provided with an embedded circuit that is not directly connected to the inputs and outputs or may be connected thereto by being specially switched. Switching elements and test islands that are connected thereto may be provided such that the input or the output of the embedded circuit may be connected to the test islands via the switching elements in case of a test. The switching elements may be switched to said test mode in case of a test by applying a voltage to the test island, or the switching elements may be switched in this manner. The arrangement may thus allow for a flexible testing system and method while the used substrate area and the number of required inputs and outputs remain low.

15 Claims, 1 Drawing Sheet

U.S. PATENT DOCUMENTS

| | | | |
|---|---|---|---|
| 5,648,730 A | | 7/1997 | Bhuva et al. |
| 5,724,502 A | * | 3/1998 | Cherichetti et al. ............ 714/28 |
| 5,825,194 A | | 10/1998 | Bhuva et al. |
| 6,068,892 A | * | 5/2000 | Ma .................................. 428/14 |
| 6,286,115 B1 | * | 9/2001 | Stubbs .......................... 714/718 |
| 6,720,785 B2 | * | 4/2004 | Bette ............................. 324/765 |
| 2002/0145440 A1 | | 10/2002 | Ohya et al. |
| 2003/0107391 A1 | * | 6/2003 | Bard et al. .................... 324/763 |
| 2009/0164857 A1 | * | 6/2009 | Haberla et al. ................ 714/719 |

FOREIGN PATENT DOCUMENTS

| | | | |
|---|---|---|---|
| EP | 0632282 A2 | * | 1/1995 |
| EP | 0 715 178 A2 | | 6/1996 |
| EP | 0 786 667 | | 7/1997 |

OTHER PUBLICATIONS

International Search Report mailed May 9, 2006.
JP Abstract of Publication No. 08181181 dated Jul. 12, 1996.

* cited by examiner

SYSTEM AND METHOD FOR TESTING EMBEDDED CIRCUITS WITH TEST ISLANDS

FIELD OF THE DISCLOSURE

Embodiments of the present disclosure relate to a system and method for the testing of an embedded circuit as a part of an overall circuit that is located on a semiconductor wafer.

BACKGROUND OF THE DISCLOSURE

Conventionally, there have been difficulties associated with arrangements of embedded circuits. In particular, these difficulties are typically associated with arrangements of embedded circuits, whose methods of testing on a semiconductor wafer include the following:
1. Connecting the embedded circuit for testing with existing inputs and outputs by multiplexers, which requires the number of inputs and outputs of the embedded circuit to be equal to or less than the number of the inputs and outputs of the overall circuit.
2. Connecting all of the inputs and outputs of the embedded circuit with a serial shift register having parallel inputs and outputs, wherein during normal operation the parallel inputs and outputs of the shift register are operated in a transparent mode, and therefore signals of an external circuit arrive unmodified at the inputs of the embedded circuit and output signals of the embedded circuit arrive unmodified at the inputs of the external circuit. In the test mode, however, test patterns are serially entered into the shift register and are also applied to the inputs of the embedded circuit by various methods; the output signals of the embedded circuit are transferred in parallel into the shift register and are serially transferred to the outside.

An advantage of conventional systems and methods is that the embedded circuit may be fully tested in parallel, thereby allowing the usage of the same test program irrespective of the embedded circuit's application. Another advantage is the possibility to allow to perform the test on the semiconductor wafer (wafer test) and in the individual device (final test). Yet another advantage of this arrangement is that the embedded circuit or a plurality of embedded circuits may be tested by using only few additional inputs and outputs of the overall circuit.

Despite these advantages, there exist several drawbacks as well. For example, a disadvantage of conventional systems and methods is the increased effort for the wiring, in particular when a plurality of embedded circuits to be tested is provided, thereby generally leading to an increase of the required semiconductor area and allowing application of this method only if the overall circuit has at least as many inputs and outputs as the embedded circuit.

Another disadvantage is the increase of the required semiconductor area owing to the additional shift registers and an appropriate circuit for controlling the shift registers. Due to the usage of the shift registers in the data path an increase of the signal propagation time is caused.

OBJECTS OF THE DISCLOSURE

It is an object of the present disclosure to provide an arrangement that allows a flexible test procedure, wherein the consumption of substrate area and the number of required inputs and outputs are low.

SUMMARY OF THE DISCLOSURE

Disclosed exemplary embodiments may include a system and method for the testing of an embedded circuit as a part of an overall circuit that is located on a semiconductor wafer.

The following description is intended to convey a thorough understanding on the embodiments described by providing a number of specific embodiments and details involving a system and method for the testing of an embedded circuit as a part of an overall circuit that is located on a semiconductor wafer. It should be appreciated, however, that the present invention is not limited to these specific embodiments and details, which are exemplary only. It is if further understood that one possessing ordinary skill in the art, in light of known systems and methods, would appreciate the use of the invention for its intended purpose and benefits in any number of alternative embodiments, depending on specific design and other needs.

Embodiments of the present disclosure may provide a semiconductor arrangement including an overall circuit having inputs and outputs, which comprises an embedded circuit having an embedded input and an embedded output that are not directly connected to at least one of the inputs and outputs. Moreover, there may be provided a switching element, a first test island connected to the switching element and the embedded input, and a second test island connected to the switching element. The switching element and the first and second test islands may be connected such that upon application of a control voltage to the second test island a connection is established between the embedded input and the first test island via the switching element.

By providing one or more additional test islands together with a corresponding switching element it may be possible to input a test signal into the embedded circuit without requiring a further terminal for the overall circuit. Since the additional test islands may be appropriately positioned in the semiconductor arrangement also an increase of the die area may efficiently be limited, since only the switching element has to be added to the basic layout and the test islands may be positioned at any appropriate location in the metallization level, which is not required by respective contact islands for inputs and outputs of the overall circuit when connecting to package contacts. By this arrangement, the possibility may be provided for applying a parallel test method that does not depend on the number of inputs and outputs of the overall circuit, while also the complexity for the wiring is significantly reduced. That is, according to embodiments of the disclosure, the testing of the embedded circuit may be made possible by the additional test islands, which in one preferable embodiment are entirely located within the area of the embedded circuit. At the same time, in one embodiment, the test islands may be formed in the uppermost metal layer of the technological process only, while in other embodiments, the testing may also be performed in an earlier manufacturing stage, for example, when the test islands are formed in a deeper metal layer so as to be accessible by measurement probes. The testing of the embedded circuit may be performed in advantageous embodiments on the semiconductor wafer only (wafer test), in that these test islands may be enabled for test only and the applied signals are passed through to the embedded circuit via appropriate circuits. In other embodiments, the test may be performed after the separating the devices prior to packaging, when a contact structure of the separated device for connection to a package still allows access to the test islands.

In another embodiment, a test island may be provided and may be connected to the embedded output. When control of the performance of the embedded circuit via the output may be necessary, this may be accomplished via the further test island.

In yet another embodiment, a switching element may be provided and may be connected such that upon applying the control voltage, the first test island may be connected to the embedded output. In this manner, the embedded output may efficiently be decoupled from the remaining circuit so that possible influences of the test island, such as parasitic capacitances, on the functional behaviour of the circuit may efficiently be suppressed.

In yet another embodiment, the switching element may be configured to decouple the embedded input from an internal output of the overall circuit upon application of the control voltage. When during a test phase the remaining portions of the overall circuit are also in operation, the arrangement may enable input of test signals independently from the remaining circuit.

In yet another embodiment, the embedded circuit may comprise a plurality of inputs and outputs, and a further switching element together with a first test island may be provided for each of the embedded inputs and outputs. In this manner, a more complex design of the embedded circuit may be provided the possibility of supplying test signals in a substantially parallel manner.

In yet another embodiment, an associated second test island may be provided for at least some of the further switching elements. Hence, at least some of the switching elements may be individually controlled, thereby achieving enhanced flexibility compared to a common control of all the switching elements.

In yet another embodiment, the overall circuit may be formed in a device level and the inputs and outputs are formed in a metal layer located above, wherein the first test island and the second test island are located entirely within an area of the metal layer that is defined by the dimensions of the embedded circuit. In this manner no additional die area is "consumed" by the test islands and thus a very compact arrangement with low wiring complexity compared to conventional systems may be achieved.

This holds true in particular when each of the first and second test islands may be within the defined area.

For example, in yet another embodiment, the metal layer may be the last metal layer within the technological manufacturing process. In this way the embedded circuit may be efficiently accessible by conventional measurement equipment.

According to another aspect of the present disclosure, a method for testing a semiconductor arrangement on a substrate wafer that comprises a plurality of semiconductor arrangements to be tested may be provided. The method may comprise forming a first test island and a second test island in a meta layer of the semiconductor arrangement that comprises an overall circuit and an embedded circuit connected to the overall circuit by an embedded input and an output, wherein the first test island is connectable to the embedded input by applying a control voltage to the second test island. Furthermore, the control voltage may be applied in order to switch the semiconductor arrangement into a test mode.

With this method the semiconductor arrangement may be set into the test mode in a non-separated state, wherein in this phase conventional measurement techniques may be used that allow an efficient contacting of the test islands.

The embedded circuit may comprise a plurality of embedded inputs, which may be connected to an associated first test island during the test mode, and in one advantageous embodiment the plurality of embedded inputs are supplied in parallel with a test pattern during the test mode such that a rapid test of the circuit may be achieved. In this manner a plurality of circuits or all circuits located on the substrate wafer may be tested with reasonable time and effort, wherein the advantages with respect to a lower number of inputs and outputs and a reduced wiring complexity may be obtained.

Further advantageous embodiments may be further defined in the following description. For example, exemplary embodiments will be explained and complemented by illustrative embodiments while referring to the drawings.

DETAILED DESCRIPTION OF THE DISCLOSURE

Figure 1:
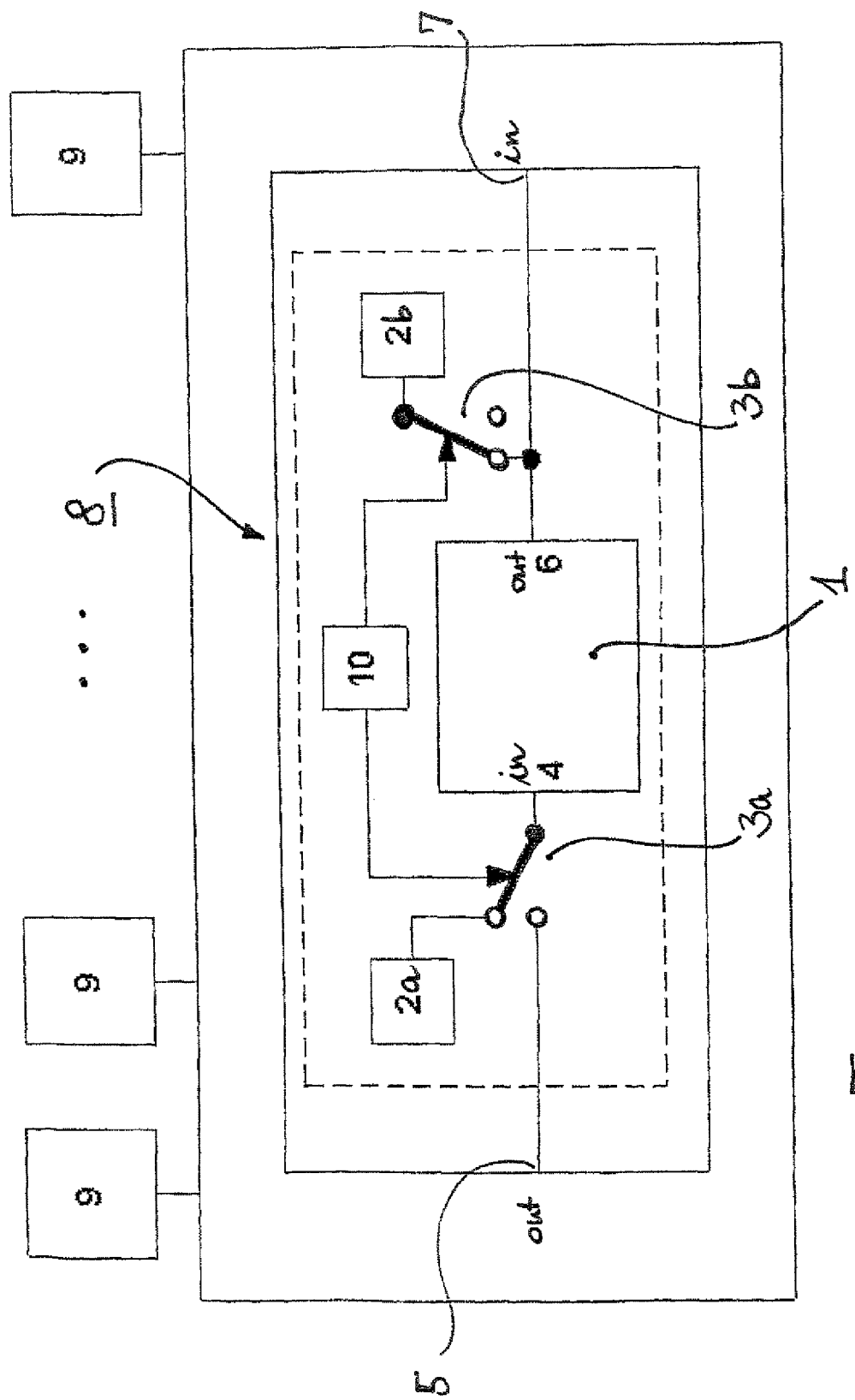
FIG. 1 depicts a schematic illustration of an overall circuit of one example of the inventive arrangement of test islands for the embedded circuit.

FIG. 1 depicts an embedded circuit 1, a test island 2, a switching element 3, input of the embedded circuit 4, an output of the overall circuit 5, output of the embedded circuit 6, input of the overall circuit 7, overall circuit 8, inputs and outputs of the overall circuit 9, and a test island 10.

In this example, the overall circuit 8 may be illustrated, comprising the embedded circuit 1 to be tested that is formed on a substrate (not shown).

The overall circuit 8 may comprise inputs and outputs 9, which may not be connected to the embedded circuit 1 and/or which may not be connected by a specific circuit. An embedded input 4 and/or an embedded output 6 of the embedded circuit 1 may be connected to test islands 2a, 2b via an associated switching element 3a, 3b.

An internal output 5 of the overall circuit 8 that is connected to the embedded input 4 of the embedded circuit 1 during the normal operation mode may be isolated by the associated switching element 3a according to the embodiment shown.

In the embodiment shown, an internal input 7 of the overall circuit 8 may also be isolated from the respective test island 2b by means of the associated switching element 3b during normal operation such that the influence of the test island 2 on the internal inputs may be reduced. The switching elements may be switched into the test mode only during the test phase by applying a control voltage to a test island 10.

In other embodiments (not shown), a plurality of embedded inputs and outputs may also be provided. For example, these plurality of embedded inputs and outputs may each comprise an associated test island that also correspond to switching elements and may be provided in order to allow at least the embedded inputs to be individually switched into the test mode. Accordingly, a parallel supply of test signals (not shown) to the individual inputs may be achieved.

In other embodiments (not shown), a plurality of switching elements may be connected to a single test island such that the plurality of inputs may be switched by a single applied control voltage.

In still further embodiments, respective configurations of the test islands 2a 2b and 10 as well as for the switching elements 3a, 3b may be provided for each of a plurality of inputs and outputs.

It should be appreciated that the test islands 2a, 2b and 10 may be formed in a metal layer (not shown), that is, for instance in a wiring level of the circuit 8, which may be located above a level according to commonly used process technologies, in which the semiconductor elements may be manufactured, such as the circuit components of the overall circuit and the embedded circuit 1 and the switching elements 3a, 3b.

The embedded circuit 1 may occupy an area in the level of the semiconductor components, which also may determine a respective area in the metal layer(s) located above, as shown in FIG. 1 by the dashed line. Herein in one advantageous embodiment, at least some of the test islands and/or each of the test islands may be located within the defined area.

The embodiments of the present disclosure are not intended to be limited in scope by the specific embodiments describe herein. Thus, modifications are intended to fall within the scope of the following appended claims. Further, although some of the embodiments of the present disclosure have been described herein in the context of a particular implementation in a particular environment for a particular purpose, those of ordinary skill in the art should recognize that its usefulness is not limited thereto and the embodiments of the present inventions can be beneficially implemented in any number of environments for any number of purposes. Accordingly, the claims set forth below should be construed in view of the full breadth and spirit of the embodiments of the present disclosure. While the foregoing description includes many details and specificities, it is to be understood that these have been included for purposes of explanation only, and are not to be interpreted as limitations of the claimed inventions. Modifications to the embodiments described above can be made without departing from the spirit and scope of the claims.

We claim:

1. A semiconductor arrangement comprising an overall circuit having outer inputs and outputs further comprising:
   an embedded circuit comprising an embedded input and an embedded output having no direct electrical connection to said outer inputs and outputs;
   at least two switching elements for said embedded circuit;
   at least two first test islands electrically connected to said switching elements and said embedded input and embedded output also electrically connected to said switching elements;
   a second test island operatively connected to said switching elements;
   wherein said switching elements upon applying a control voltage to said second test island electrically connect said embedded input to a first of said first test islands via a first of said switching elements and said embedded output to a second of said first test islands via a second of said switching elements.

2. The semiconductor arrangement of claim 1, wherein the first of said switching elements is configured to disconnect said embedded input from an internal output of said overall circuit when the control voltage is applied.

3. The semiconductor arrangement of claim 1 wherein said embedded circuit comprises a plurality of embedded inputs and outputs and wherein a further switching element and a further first test island is provided for each of the embedded inputs and each of said embedded outputs.

4. The semiconductor arrangement of claim 3, wherein at least for some of the further switching elements an associated second test island is provided.

5. The semiconductor arrangement of claim 1, wherein said overall circuit is formed in a device level and said inputs and outputs are formed in a metal layer located above the device level, and wherein said first test islands and said second test island are located entirely within an area in the metal layer that is defined by dimensions of the embedded circuit.

6. The semiconductor arrangement of claim 5, wherein the metal layer is a last metal layer in a technological manufacturing process.

7. A semiconductor arrangement comprising:
   an overall circuit having at least an outer input and an outer output,
   wherein said overall circuit comprises an embedded circuit that is not directly connected to said outer input and outer output nor is it connectable thereto via a specific circuit,
   wherein
      switching elements, test islands and a test initiating island for said embedded circuit, are provided and operate such that during a test mode an input and an output of said embedded circuit are connectable to a respective one of test islands via a respective one of said switching elements,
      said switching elements operate to switch only during a testing into said test mode by applying a voltage to said test initiating island.

8. The arrangement of claim 7, wherein the embedded circuit comprises a plurality of embedded inputs and outputs and wherein for each input and output there is provided a switching element and a test island, and an associated test initiating island for initiating switching.

9. The arrangement of claim 7, wherein the overall circuit consists of a plurality of embedded circuits, wherein for each of the plurality of embedded circuits switching elements and test islands are provided such that each of the plurality of embedded circuits can be individually switched into the test mode.

10. The arrangement of claim 7, wherein the test islands are located entirely within an area of the embedded circuit and are formed only by an uppermost metal layer provided in a technological process used for manufacturing the semiconductor arrangement.

11. A method of testing a semiconductor arrangement on a substrate wafer that comprises a plurality of semiconductor arrangements to be tested, the method comprising:
   providing an overall circuit and an embedded circuit connected to the overall circuit via an embedded input and an embedded output, wherein a first test island in a metal layer of the semiconductor arrangement is connectable to the embedded input via a first switching element to a second test island in said metal layer;
   applying a control voltage and switch the tested semiconductor arrangement into a test mode by operation of said first switching element.

12. The method of claim 11, further comprising: disconnecting the embedded input from an internal output of the overall circuit during the test mode.

13. The method of claim 11, further comprising: providing a further first test island that is connected to the embedded output by operation of a second switching element.

14. The method of claim 13, wherein the further first test island is connected to the embedded output during the test mode only.

15. The method of claim 11, wherein the embedded circuit comprises a plurality of embedded inputs that are connectable to associated first test islands during the test mode and wherein the plurality of embedded inputs are supplied in parallel with a test pattern during the test mode.

* * * * *

UNITED STATES PATENT AND TRADEMARK OFFICE
CERTIFICATE OF CORRECTION

PATENT NO.        : 7,994,806 B2
APPLICATION NO.   : 11/817066
DATED             : August 9, 2011
INVENTOR(S)       : Holger Haberla et al.

Page 1 of 1

It is certified that error appears in the above-identified patent and that said Letters Patent is hereby corrected as shown below:

On the title page, please correct "Halberla" with --Haberla-- to read:

(75) Inventors: Holger Haberla, Kranichfeld (DE);
                Soeren Lohbrandt, Buessleben (DE)

Signed and Sealed this
Fifteenth Day of November, 2011

David J. Kappos
*Director of the United States Patent and Trademark Office*